(12) United States Patent
Chapalain et al.

(10) Patent No.: US 6,993,697 B2
(45) Date of Patent: Jan. 31, 2006

(54) METHOD FOR OBTAINING FROM A BLOCK TURBO-CODE AN ERROR CORRECTING CODE OF DESIRED PARAMETERS

(75) Inventors: Nadine Chapalain, Rennes (FR); Arnaud Gueguen, Rennes (FR); Damien Castelain, Rennes (FR)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 414 days.

(21) Appl. No.: 10/307,947

(22) Filed: Dec. 3, 2002

(65) Prior Publication Data
US 2003/0126548 A1    Jul. 3, 2003

(30) Foreign Application Priority Data
Dec. 3, 2001   (EP) ................................. 01403102

(51) Int. Cl.
*H03M 13/00*    (2006.01)
(52) U.S. Cl. ................... 714/752; 714/753; 714/791
(58) Field of Classification Search ............... 714/753, 714/755, 786, 774, 723, 791
See application file for complete search history.

(56) References Cited

U.S. PATENT DOCUMENTS

| | | | | |
|---|---|---|---|---|
| 4,908,827 A | * | 3/1990 | Gates | ......................... 714/790 |
| 5,438,590 A | * | 8/1995 | Tzukerman et al. | ......... 375/259 |
| 5,721,745 A | * | 2/1998 | Hladik et al. | ................ 714/755 |
| 5,983,384 A | * | 11/1999 | Ross | ........................... 714/755 |
| 6,119,264 A | * | 9/2000 | Berrou et al. | ................ 714/786 |
| 6,516,441 B1 | * | 2/2003 | Kim et al. | ................... 714/774 |
| 6,629,286 B1 | * | 9/2003 | Berens et al. | ................ 714/755 |

* cited by examiner

*Primary Examiner*—Guy Lamarre
*Assistant Examiner*—Fritz Alphonse
(74) *Attorney, Agent, or Firm*—Oblon, Spivak, McClelland, Maier & Neustadt, P.C.

(57) ABSTRACT

The present invention concerns a method for obtaining an error correcting code of a given first size (N), including a systematic information part of a given second size (K) and a redundancy part. A block turbo-code is first obtained from said systematic information part and from predetermined information elements provided at known locations, said block turbo-code consisting in a product of elementary systematic block codes, at least said predetermined information elements being removed from the obtained block turbo-code to produce a shortened block turbo-code. An additional error correcting code is derived from at least a portion of said shortened block turbo-code and said shortened block turbo-code is stuffed with stuffing elements so as to attain said given first size, said stuffing elements being information elements of said additional error correcting code.

20 Claims, 6 Drawing Sheets

METHOD FOR OBTAINING FROM A BLOCK TURBO-CODE AN ERROR CORRECTING CODE OF DESIRED PARAMETERS

BACKGROUND OF THE INVENTION

1. Field of the Invention

The present invention concerns in general terms a method for obtaining from a block turbo-code an error correcting code of desired parameters The invention concerns also a method for decoding such an error correcting code

2. Description of the Related Art

As it is well known, turbo-codes were originally introduced by C Berrou, A. Glavieux and P. Thitimajshima in an article entitled "Near Shannon Limit Error Correcting and Decoding Turbo-codes" published in ICC-1993 Conference Proceedings, pages 1064–1070 Turbo-codes have subsequently been the subject of many developments Broadly speaking, the turbo-coding principle is based on the concatenation of a plurality of elementary coding steps, each using a simple code, hereinafter referred to as elementary code. The elementary coding steps are separated by interleaving steps modifying the order in which the data is taken into account Two large classes of turbo-codes are distinguished parallel turbo-codes where the elementary coding steps are carried out in parallel and serial turbo-codes where the elementary coding steps are carried out sequentially. Block turbo-codes (BTCs) are a special class of serial turbo-codes where the elementary codes are block codes like Hamming, RS (Reed Solomon) or BCH (Bose-Chaudhuri-Hocquenghem) codes FIG. 1 illustrates schematically the structure of a block turbo-coder The block turbo-coder 100 comprises elementary block coders $110_1$, $110_P$ concatenated in series, where P is called the dimension of the turbo-code. The turbo-coder operates on data block of P dimensions, each elementary coder operating on one dimension only. Without loss of generality, it will be assumed in the following that P=2.

A block of data represented by a matrix of $k_1 \times k_2$ symbols is input to a first block coder $110_1$. It should be noted that, depending on the type of block code, the symbols may be bits or words The first block coder $110_1$ operates on the rows (or the columns) of the matrix and appends to the original data (also called the systematic information or the systematic part) a first redundance information (or redundancy part, here represented by a dotted area) to form a matrix of size $n_1 \times k_2$. The second block coder $110_2$ operates on the columns (or the rows) of the $n_1 \times k_2$ matrix and appends thereto a second redundancy information (dotted area) to form a matrix of size $n_1 \times n_2$ The systematic part is represented by the blank area of size $k_1 \times k_2$ In general, an error correcting code is denoted (N,K,D) where N is the size of the code, K is the size of the original information (ie the size of the systematic information in case of a systematic code) and D is the minimum Hamming distance of the code If $(n_1, k_1, d_1)$ and $(n_2, k_2, d_2)$ are respectively the block codes used by the first and the second block coders, the resulting turbo-code is in fact a product code of minimum Hamming distance $d=d_1 \times d_2$ and therefore denoted $(n_1 \times n_2, k_1 \times k_2, d_1 \times d_2)$. Hence, by concatenating block codes of small Hamming distances a block turbo-code can be obtained with a much larger Hamming distance The coded data output by the block turbo-coder is M-ary or binary modulated (eg BPSK modulated) prior to being transmitted over a transmission channel At the receiving side, a demodulator outputs soft values reflecting the probabilities of transmitted M-ary symbols or bits. These soft values can be labelled in terms of probabilities, likelihood ratios or, more commonly, in terms of log likelihood ratios (LLRs)

FIG. 2 illustrates schematically the structure of a block turbo-decoder The information is presented as a P-dimensional block of soft values supplied by the demodulator. The turbo-decoding process involves a series of iterations 1, ,k, upon the input block, each iteration consisting in a concatenation of elementary decoding steps, each elementary decoding step operating on one dimension of the input block. For example, (1) in FIG. 2 represents the concatenation of elementary decoding steps (or elementary decoders) $210_1^{(1)}, \ldots, 210_P^{(1)}$) of the first iteration and (k) represents the concatenation of the elementary decoding steps (or elementary decoders) $201_1^{(k)}, \ldots, 210_P^{(k)}$ of the last iteration The last iteration is followed by a hard decision 220, eg a thresholding, for obtaining the decoded bits or words The input information of an elementary decoder is so called a priori information and consists of a noisy version of the output of the corresponding elementary coder. From this information and the coding law of the corresponding elementary coder, the elementary decoder generates an a posteriori information, which is an estimation of higher reliability of the information input to the corresponding elementary coder The additional information provided by the a posteriori information with respect to the a priori information is referred to as extrinsic information Various algorithms can be used in the elementary decoders $210_i^{(j)}$, for example the Chase algorithm disclosed in the article (entitled "Near optimum product codes" published in Proc IEEE Globecom of 1994, pages 339–343, or the algorithm described in the article of J Lodge et al. entitled "Separate MAP filters for the decoding of product of concatenated codes" published in Proc ICC'93, pages 1740–1745.

Each elementary decoder receives the entirety of the input block and carries out an estimation of the soft values of the said block, according to the coding dimension of the corresponding elementary coder, by using for example the Chase algorithm mentioned above If the soft values are expressed in terms of LLRs, the a posteriori information output by the decoder is subtracted from the a priori information to obtain a block of extrinsic information having the same size as the input block. The extrinsic information is then added to the input block to serve as a priori information for the next elementary decoder. It should be noted that the order of the elementary decoders/decoding steps is of a little importance, each operating on one or hogonal dimension of the n-dimensional block. By successive passes from one dimension to another and from one iteration to the next one, the estimation of the systematic information gains reliability More specifically, the structure of an elementary decoder decoding the pth dimension is represented in FIG 3. The input block is represented by a matrix R of soft values supplied by the demodulator, assumed to be expressed here in terms of LLRs The elementary decoder inputs a matrix of extrinsic values $W_p$ and outputs a matrix of extrinsic values $W_{p+1}$, the matrix of extrinsic values input by the first decoder at the first iteration being $W_1=0$ The extrinsic values are then weighted in 310 by a weighting factor $\alpha_p$ before being added to the soft values of the matrix R The purpose of the weighting factor $\alpha_p$ is to reduce the contribution of the extrinsic information, the reliability of which is low during the first iterations The resulting matrix $R_p$ of soft values can therefore be written $$R_p = R + \alpha_p W_p \quad (1)$$

The soft values are decoded in 330 eg by using the Chase algorithm, thus providing an a posteriori information of higher reliability represented by a matrix $R'_p$ of soft values A new matrix of extrinsic values is obtained by subtracting in 340 the a priori information to the a posteriori information, that is.

$$W_{p+1} = R'_p - R_p \quad (2)$$

At the last iteration, the systematic part of $R'_p$ is thresholded in the hard decision unit 2

An important characteristic of an error correcting code of parameters (N,K,D) is the ratio R=K/N, called the code rate, which gives the coding efficiency of the code The parameters of a product code of elementary codes $(n_p, k_p, d_p)$, denoted $$\prod_{p=1}^{P} (n_p, k_p, d_p)$$

are given by.

$$N = \prod_{p=1}^{P} n_p; \; K = \prod_{p=1}^{P} k_p, \; D = \prod_{p=1}^{P} d_p \quad (3)$$

and therefore $$R = \prod_{p=1}^{P} r_p$$

where $r_p - k_p/n_p$ is the code rate of the pth elementary code

Another important characteristic of an error correcting code is the so called asymptotic gain of the code, defined as the ratio, expressed in decibels, of the energies per information bit $E_b$ which are necessary, without coding and with coding, respectively, for achieving a given binary error rate (BER) The asymptotic gain G of a product code is equal to the sum of the asymptotic gains of the elementary codes $$G = \sum_{p=1}^{P} G_p \quad (4)$$

In practice, for a given telecommunication system, the values of the parameters K' and N' of an error correcting code are often imposed On the other hand, the parameters $n_p$ and $k_p$ of the known block codes $(n_p, k_p, d_p)$ cannot take but few possible values It follows (3) that a block turbo-code offers a very limited choice in terms of available parameters K and N Furthermore, it is often found necessary to adapt the error correcting code parameters to the condition of the transmission channel. For example, if the quality of the transmission channel is good, a code of high rate can be chosen whereas if the quality of the transmission channel is poor, a code of low rate is required. In order to broaden the choice of values for the parameters K and N of a block turbo-code, the general techniques of code shortening, code puncturing can be applied The shortening of a block code (n,k,d) consists in setting to zero a plurality s of bits (called shortened bits) of the information to be coded Although these zero values are taken into account for generating the redundancy part, they are not transmitted to the receiver. The k−s remaining bits of the systematic information and the n−k bits of the redundancy information define a shortened code (n−s,k−s,d) where d≧d. At the receiving side, the decoder knows the positions and values (equal to 0) of the shortened bits and therefore they can be given the highest level of reliability (i.e. −1 if LLRs are used). The a priori knowledge of the s shortened bits improves the decoding of the n−s remaining bits. Shortened block codes can be concatenated to form a shortened block turbo code denoted $$\prod_{p=1}^{P} (n_p - s_p, k_p - s_p, d_p^s)$$

Typically, the shortened bits are arranged along rows and columns to simplify the decoding process. FIG. 4 shows an example of such a bidimensional shortened block turbo code. The shortened bits set to zero have been illustrated by the areas filled in grey The parameters of the illustrated shortened code are $((n_1-s_1) \times (n_2-s_2), (k_1-s_1) \times (k_2-s_2), (d_1 \times d_2))$ and hence the rate of the shortened code is lower than the rate of the original code.

$$R_1 = \frac{(k_1 - s_1)(k_2 - s_2)}{(n_1 - s_1)(n_2 - s_2)} < R \quad (5)$$

The puncturing of a code consists in omitting to transmit certain bits of the code, most often belonging to the redundancy part if the code is systematic. At the receiving side, the punctured bits are attributed any value and the lowest reliability level (0 if LLRs are used).

FIG. 5 shows a punctured bidimensional block turbo code. The punctured bits are represented by squares filled in black. If x is the total number of punctured bits, the parameters of the punctured code are $(n_1 n_2, k_1 k_2 - x, d)$ with d<d and the rate of the punctured code is higher than rate of the original code $$R_1 = \frac{k_1 k_2}{n_1 n_2 - x} > R \quad (6)$$

Since the number of parity bits is lower and since the punctured bits have the lowest reliability level, the gain of the punctured code is lower than the gain of the original code The combination of shortening and puncturing significantly extends the choice of achievable parameters In particular, for a shortened and punctured bidimensional block turbo-code, the parameters are $((n_1-s_1) \times (n_2-s_2)-x, (k_1-s_1) \times k_2-s_2), d_1^s \times d_2^s)$ and therefore the code rate can be written.

$$R_{sp} = \frac{(k_1 - s_1)(k_2 - s_2)}{(n_1 - s_1)(n_2 - s_2) - x} \quad (7)$$

By carefully choosing the parameters of the elementary block codes, the shortening lengths and the amount of punctured bits, the desired parameters N,K can be obtained These codes are called parametric block turbo-codes.

However, the larger choice of parameters is balanced by the lower asymptotic gains of the codes obtained, basically due to puncturing.

It has been proposed in the prior art, e.g in EP-A-827285, to distribute uniformly the shortened bits along the different dimensions of the turbo-code and next to the punctured bits. Such a turbo-code is illustrated in FIG. 6 where the punctured bits are represented in black and the shortened bits in grey. By so doing, the high reliability of the shortened bits compensates for the low reliability of the punctured bits and consequently improves the asymptotic gain value of the shortened punctured turbo-code However, the puncturing necessary implies at waste of redundancy and therefore a sub-optimal asymptotic gain

SUMMARY OF THE INVENTION

It is therefore a first object of the invention to obtain from a block turbo-code an error correcting code having the desired parameters N,K and exhibiting a higher gain than in the prior art A second object of the invention is to obtain said error correcting code of desired parameters without puncturing The object of the invention is achieved by the method defined in claim 1 The object of the invention is also defined by the decoding method set out claim 7

BRIEF DESCRIPTION OF THE DRAWINGS

The characteristics of the invention mentioned above, as well as others, will emerge more clearly from a reading of the following description in relation to the accompanying figures, amongst which.

DETAILED DESCRIPTION OF THE PREFERRED EMBODIMENTS

Figure 1:
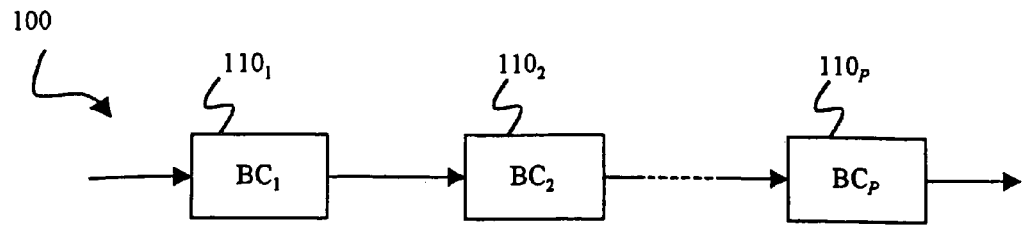
FIG. 1 depicts schematically the general structure of a block turbo-coder.
Figure 1:
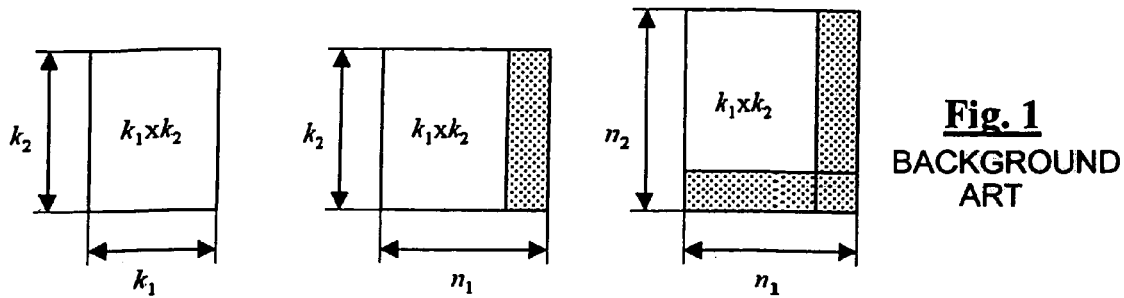
Figure 2:
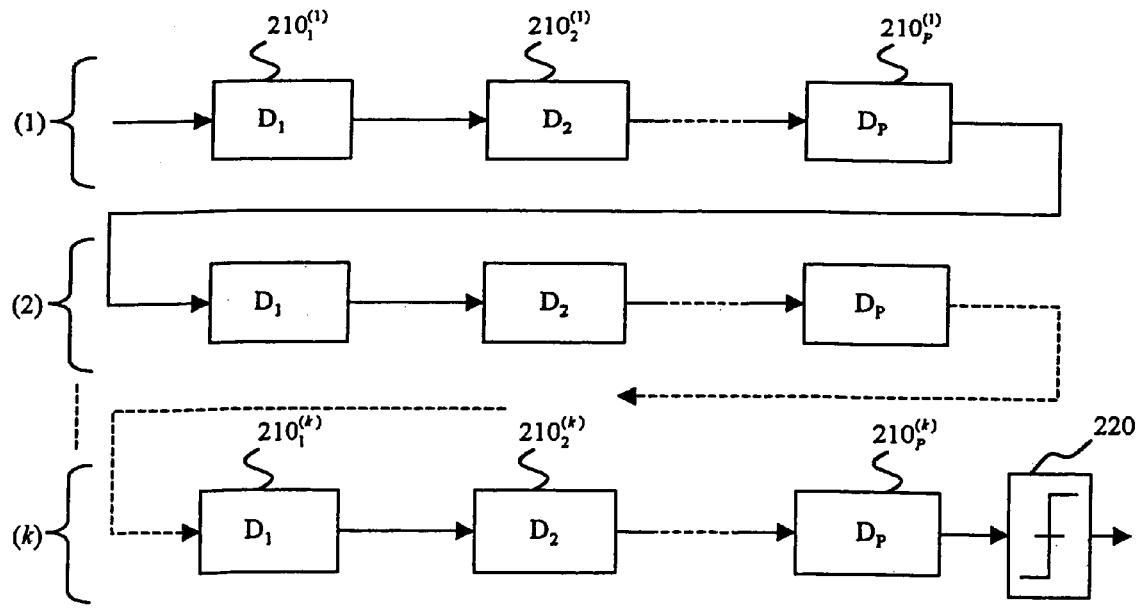
FIG. 2 depicts schematically the general structure of a block turbo-decoder.
Figure 3:
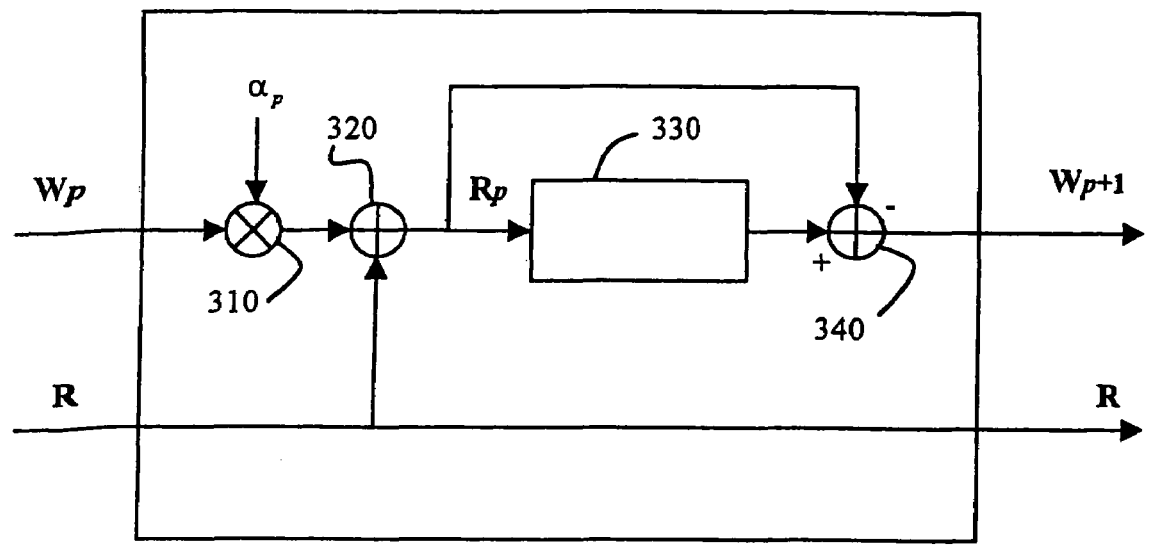
FIG. 3 depicts schematically the structure of an elementary decoder for one dimension of the turbo-code.
Figure 4:
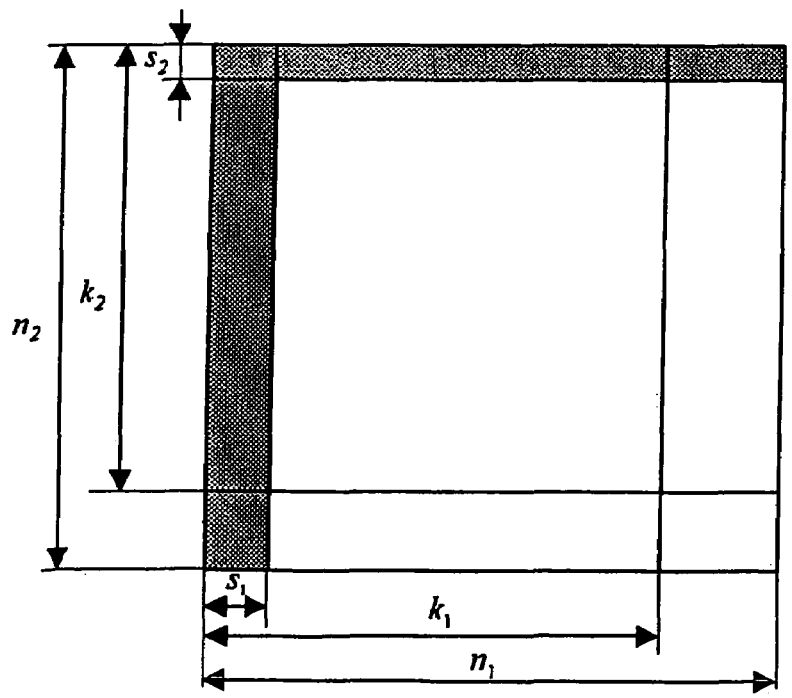
FIG. 4 represents a bidimensional shortened block turbo-code.
Figure 5:
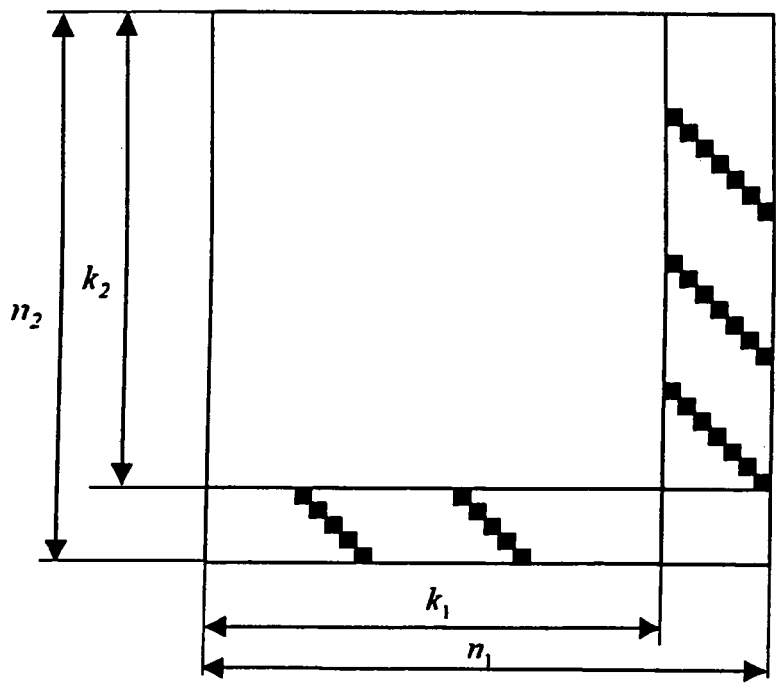
FIG. 5 represents a bidimensional punctured block turbo-code.
Figure 6:
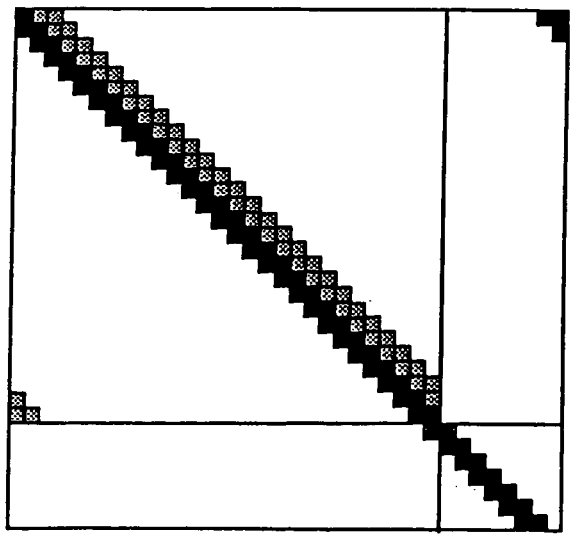
FIG. 6 represents a bidimensional shortened and punctured block turbo-code according to the prior art.

The general idea at the basis of the invention is to jointly use a combination of code shortening and bit stuffing, the stuffing bits being obtained by applying an additional error correcting code to the shortened block turbo-code.

In general, bit stuffing consists in adding, eg. appending dummy bits to a codeword to be transmitted At the receiver side, the stuffing bits are stripped away from the codeword and the decoding process operates on the remaining bits If (n,k,d) are the parameters of a block code and z is the number of stuffing bits, the parameters of the stuffed code are (n=z,k,d) and the new code rate is therefore lower than the original code rate $$R_{stf} = \frac{k}{n+z} \quad (8)$$

Let us suppose that an error correcting code of given parameters N, K is required and that two systematic block codes of parameters $(n_1, k_1, d_1)$ and $(n_2, k_2, d_2)$ respectively are chosen such that $$k_1 k_2 \geq K \quad (9.1)$$

$$n_1 n_2 \geq N \quad (9.2)$$

and, if a minimum coding gain $G_{min}$ is required, such that they also meet the constraint $$G_1 + G_2 \geq G_{min} \quad (9.3)$$

The product code or block turbo-code, $(n_1, k_1, d_1) \times (n_2, k_2, d_2)$ has a codelength of $n_1 n_2$ bits and comprises $k_1 k_2$ systematic bits In order to obtain the desired amount of systematic bits, $k_1 k_2 - K$ systematic bits must be removed or, in other words, shortened As we have already seen above, shortening can be achieved by setting entire rows and/or columns and/or isolated bits to zero It $s_1$ columns and $s_2$ rows of the product code are shortened, the amount of systematic bits shortened in the row/column shortening operation is $$k_1 k_2 - (k_1 - s_1)(k_2 - s_2) = k_1 s_2 + k_2 s_1 - s_1 s_2 \quad (10)$$

and the total amount of row/column shortened bits $$n_1 n_2 - (n_1 - s_1)(n_2 - s_2) = n_1 s_2 + n_2 s_1 - s_1 s_2 \quad (11)$$

The remaining amount of isolated systematic bits to be shortened in order to obtain K systematic bits is therefore $$k_1 k_2 - (k_1 s_2 + k_2 s_1 - s_1 s_2) - K \quad (12)$$

After having shortened said isolated systematic bits, the codelength becomes, taking into account (11) and (12)

$$n_s = n_1 n_2 - (n_1 s_2 + n_2 s_1 - s_1 s_2) - (k_1 k_2 - (k_1 s_2 + k_2 s_1 - s_1 s_2) - K) \quad (13)$$

that is:

$$n_s = n_1 n_2 - s_2(n_1 - k_1) - s_1(n_2 - k_2) - (k_1 k_2 - K) \quad (14)$$

Only the first term in (14) is positive. It is assumed that $s_1$, $s_2$ are chosen so that $n_2 \leq N$.

According to the invention, stuffing bits in an amount of $$N - n_s = (k_1 k_2 - K) - (n_1 n_2 - N) + s_2(n_1 - k_1) + s_1(n_2 - k_2) \quad (15)$$

are inserted after the code shortening step. The stuffing bits are obtained by applying an error correction code (referred to in the following as additional error correction code) to the shortened code. Advantageously, a simple code is chosen as additional error correction code, for example a replication code or a parity code.

Figure 7A:
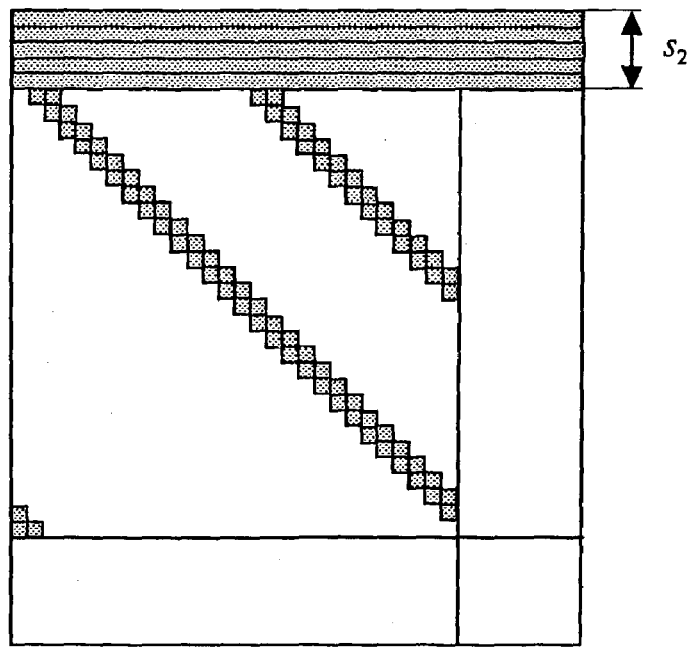
FIGS. 7A and 7B represent two steps of the method according to the invention for obtaining an error correcting code of parameters N,K, starting from a bidimensional block turbo-code.
Figure 7B:
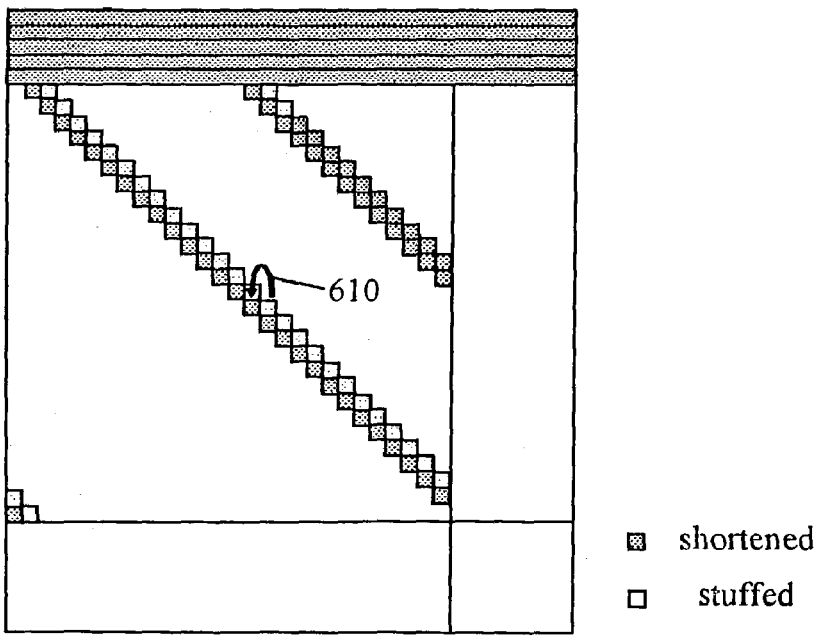

FIGS. 7A and 7B illustrate with an example how the desired code of parameters N,K is obtained from the block turbo-code $(n_1, k_1, d_1) \times (n_2, k_2, d_2)$ FIG. 7A shows the result of the bit shortening step, where the shortened bits are represented in dark grey. Here, five rows and no column have been shortened ($s_1=0$ and $s_2=5$) as well as bits uniformly distributed along the two dimensions of the code (see diagonals) It is emphasized that the shortened bits are not transmitted but are taken into account for the calculation of the redundancy part of the product code FIG. 7B shows the result of the bit stuffing step, where the stuffing bits are represented in light grey According to an embodiment of the invention, the stuffing bits take the place of some of the shortened bits, in the amount given by (15). According to a first variant, the stuffing bits are scattered pseudo-randomly over the systematic part According to a second variant, the stuffing bits are distributed according to a regular uniform distribution law over the systematic part, eg along the diagonal or diagonals thereof It is emphasized that the stuffing bits are not taken into account for the calculation of the redundancy pan of the product code but are transmitted though The stuffing bits are obtained by applying said additional correcting code For example, each stuffing bit can be a replicate of its right neighbour as indicated by arrow 610.

A numerical example will better explain the shortening and bit stuffing process according to the invention. Let us assume that we have to realize a coder which inputs K=424 bits and outputs N=832 bits, i.e. which has an imposed code rate of R=424/832=0 51

Figure 8:
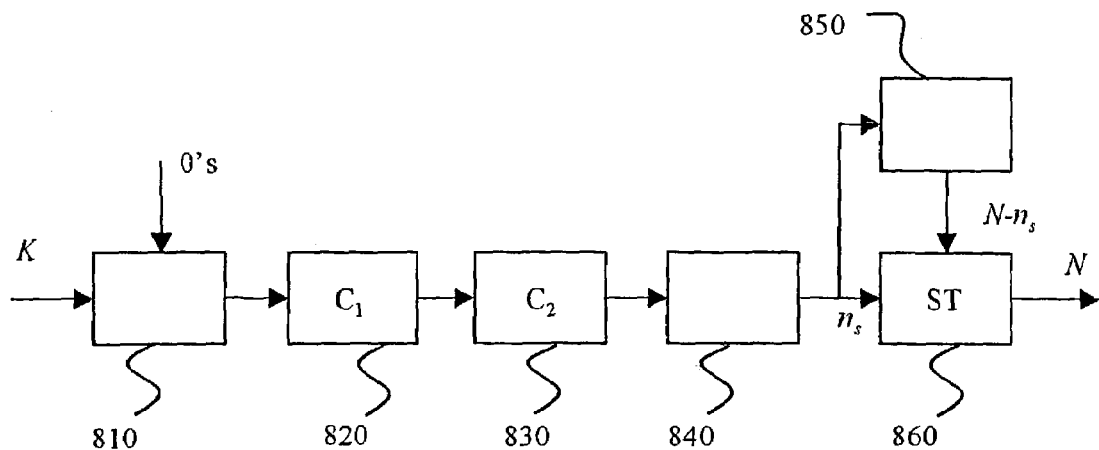
FIG. 8 depicts schematically a coder according to the invention for generating said code of parameters N,K.

Let us now consider a turbo-code consisting in the concatenation of two identical BCH (32,26,4) codes. The constraints 9.1 and 9.2 are met since $26^2 > 424$ and $32^2 > 832$. The amount of systematic bits to be shortened is $26^2 - 424 = 252$ Let us further assume that $s_2=6$ rows and no column are shortened. The amount of isolated systematic bits to be shortened is therefore $252 - 6 \times 26 = 96$ bits. The total amount of shortened bits is equal to the sum of the number of bits (systematic and redundant) of the shortened rows and the number of the shortened isolated systematic bits, that is $32 \times 6 + 96 = 288$ bits. After the shortening step, the total amount of remaining bits is equal to: $32^2 - 288 = 736$ bits. This amount is lower than the desired codelength 832 and therefore $832 - 736 = 96$ stuffing bits are inserted in the shortened code, for example at the locations of the 96 shortened systematic bits Each stuffing bit is preferably a replicate of a neighbouring bit FIG. 8 shows schematically the structure of a coder according to the invention allowing to obtain a code of parameters N,K starting from a block turbo-code $(n_1, k_1, d_1) \times (n_2, k_2, d_2)$. In module 810, the K information in bits as well as zeros at the locations of the shortened bits are arranged in a $k_1 \times k_2$ matrix The concatenated coders 820 and 830 carry out the $(n_1, k_1, d_1)$ and $(n_2, k_2, d_2)$ coding respectively. The bits to be shortened (rows, columns and "isolated" bits) are removed in 840 The additional correcting code is applied in 850 to the shortened turbo code output from 840 The N−n, error correcting bits thus obtained are used in 860 for stuffing the turbo-code at predetermined locations The stuffed shortened turbo-code contains the required amount of N bits.

Figure 9:
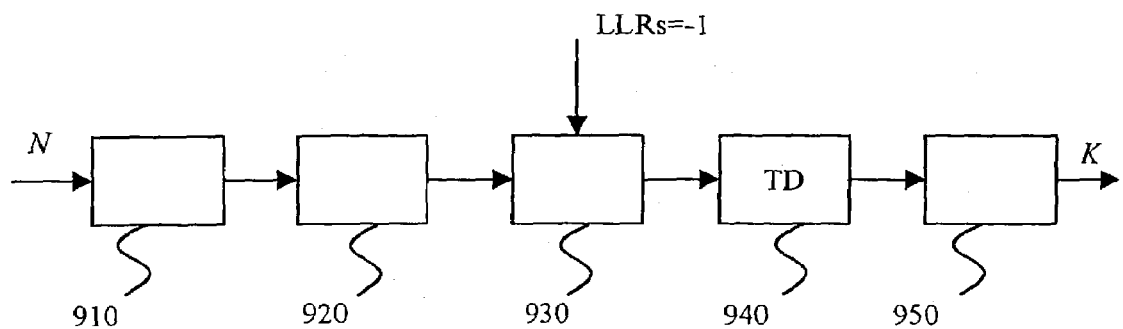
FIG. 9 depicts schematically a decoder according to the invention for decoding the code generated by the coder of FIG. 8.

FIG. 9 shows schematically the structure of a decoder according to the invention The decoder receives after demodulation a block of N soft values The N−n, stuffed values are used in the soft pre-decoder 910 for error correcting the shortened turbo-code For example, if the stuffed bits are replicates of information bits and the soft values expressed as LLRs, the soft value of an information bit is averaged with the soft value of its replicate in order to obtain an estimation of higher reliability. After pre-decoding, the soft values corresponding to the stuffed bits are removed from the received block in 920 Zeros with the highest reliability level are inserted in 930 at the locations of the shortened bits, i.e −1's are inserted if LLRs are used The iterative turbo-decoding process is performed in 940 and the shortened bits are then removed in 950 to output a block of K bits.

Figure 10:
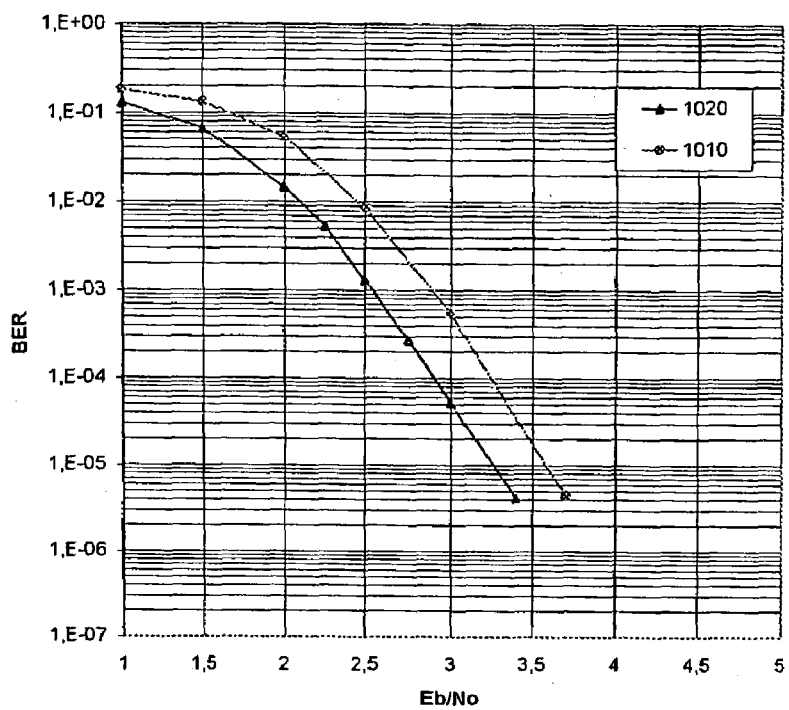
FIG. 10 illustrates the BER for a block turbo-code according to the invention and a conventional block turbo-code, respectively.

FIG. 10 shows the BER (Bit Error Rate) versus $E_b/N$ for the example of the shortened BTC (832,424) set out above The curve (1010) relates to the shortened RTC without bit stuffing and the curve (1020) relates to the shortened BTC stuffed with replicates. As it can be seen by comparing curves (1010) and (1020), the insertion of the stuffing bits significantly improves the BER.

Figure 11:
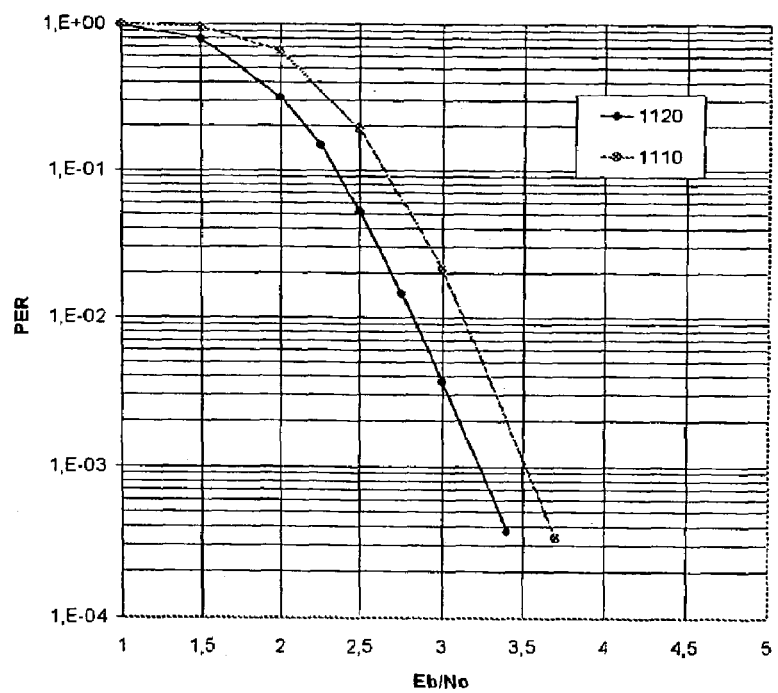
FIG. 11 illustrates the PER for a block turbo-code according to the invention and a conventional block turbo-code, respectively

FIG. 11 shows the PER (Packet Error Rats) versus $E_b/N$ for the same example. The curve (1110) relates to the shortened RTC without bit stuffing and the curve (1120) relates to the shortened BTC stuffed with replicates. As it can be seen by comparing curves (1110) and (1120), the insertion of the stuffing bits significantly improves the PER.

Although the code of parameters N,K has been obtained from a bidimensional block turbo-code, it should be clear to the man skilled in the an that a block turbo-code of higher dimension could have been used instead.

It should also be clear that the various modules of the coder illustrated in FIG. 8 have been introduced for explanatory purposes only. In practice, the coder can be realised by a plurality of processors, each carrying out one or a plurality of coding steps, or by a single processor performing them all. This remark applies equally to the decoder of FIG. 9.

What is claimed is:

1. A method for obtaining an error correcting code of a given first size (N), said error correcting code including a systematic information part of a given second size (K) and a redundancy part, according to which a block turbo-code is first obtained from said systematic information part and from predetermined information elements provided at known locations;

said block turbo-code being a product of elementary systematic block codes;

at least said predetermined information elements being removed from said block turbo-code to produce a shortened block turbo-code, said method comprising:

deriving an additional error correcting code from at least a portion of said shortened block turbo-code; and stuffing said shortened block turbo-code with stuffing elements to attain said given first size, said stuffing elements being information elements of said additional error correcting code.

2. The method for obtaining an error correcting code according to claim 1, wherein:

said stuffing elements are information elements of said redundancy part of said additional error correcting code.

3. The method for obtaining an error correcting code according to claim 2, wherein:

said error correcting code is a replication code.

4. The method for obtaining an error correcting code according to claim 1, wherein:
said stuffing elements are inserted in said block turbo-code at locations where said predetermined information elements have been removed.

5. The method for obtaining an error correcting code according to claim 4, wherein:
said information elements of said error correcting code are inserted according to a pseudo-random pattern.

6. The method for obtaining an error correcting code according to claim 4, wherein:
said information elements of said error correcting code are inserted according to a uniform regular pattern.

7. The method for decoding an error correcting code obtained by a method according to claim 1, wherein:
said error correcting code is provided by a demodulation step as a first block of soft values;
a soft pre-decoding step using soft values corresponding to said stuffing elements is performed to produce a second block of soft values of higher reliability;
a removing step where the soft values corresponding to said stuffing elements are removed from said second block is performed;
said predetermined information elements are then inserted in said second block at said known locations as soft values of highest reliability to produce a third block of soft values;
said third block of soft values is turbo-decoded; and
said predetermined information elements are removed from said turbo-decoded block to produce a systematic information part having said given second size.

8. A coder for coding a block of information elements having a given second size (K) into an error correcting code having a given first size (N), said coder comprising;
means for inserting at known locations predetermined information elements;
means for turbo-coding a resulting block of the means for inserting by applying a product of elementary systematic block codes;
means for removing at least said predetermined information elements from the turbo-coded block to produce a shortened block turbo-code;
additional error correction coding means for coding at least a portion of said shortened block turbo-code; and
stuffing means for stuffing said shortened block turbo-code with information elements of said additional error correcting code.

9. A decoder for decoding a first block of soft values corresponding to an error correcting code generated by a coder according to claim 8, said decoder comprising:
means for performing a soft pre-decoding step using the soft values corresponding to the stuffing elements and for producing a second block of soft values of higher reliability;
means for removing front said second block the soft values corresponding to said stuffing elements;
means for inserting in said second block predetermined information elements with the highest reliability level at said known locations to produce a third block of soft values;
means for turbo-decoding said third block of soft values; and
means for removing from said turbo-decoded block said predetermined information elements to produce an information block having said second size.

10. The coder according to claim 8, wherein:
said stuffing means stuffs information elements of a redundancy code part obtained from said additional error correction coding means.

11. The coder according to claim 10, wherein:
said error correcting code is a replication code.

12. The coder according to claim 8, wherein:
said error correcting code is a replication code.

13. The coder according to claim 8, wherein:
said stuffing means stuffs information elements in said shortened block turbo-code at locations where said predetermined information elements have been removed.

14. The coder according to claim 13, wherein:
said information elements of said error correcting code are inserted according to a pseudo-random pattern.

15. The coder according to claim 13, wherein:
said information elements of said error correcting code are inserted according to a uniform regular pattern.

16. The coder according to claim 8, wherein:
said error correcting code is provided as a first block of soft values by demodulation;
a second block of soft values of higher reliability is produced using soft values corresponding to said information elements stuffed by said stuffing means;
said soft values corresponding to said information elements stuffed by said stuffing means are removed from said second block;
a third block of soft values is produced by inserting said predetermined information elements in said second block at said known locations using said means for inserting;
said third block of soft values is turbo-decoded; and
said predetermined information elements are removed from said turbo-decoded block using said means for removing to produce a systematic information part having said given second size.

17. A computer program product storing instructions for execution on a computer system, which when executed by the computer system, causes the computer system to obtain an error correcting code of a given first size (N), said error correcting code including a systematic information part of a given second size (K) and a redundancy part, according to which
a block turbo-code is first obtained from said systematic information part and from predetermined information elements provided at known locations,
said block turbo-code is a product of elementary systematic block codes,
at least said predetermined information elements are removed from said block turbo-code to produce a shortened block turbo-code,
by performing the steps of:
deriving an additional error correcting code from at least a portion of said shortened block turbo-code; and
stuffing said shortened block turbo-code with stuffing elements to attain said given first size, said stuffing elements being information elements of said additional error correcting code.

18. The computer program product according to claim 17, wherein:
said stuffing elements are information elements of said redundancy part of said additional error correcting code.

19. The computer program product according to claim 18, wherein:

said error correcting code is a replication code.

20. The computer program product according to claim 17, wherein:

said stuffing elements are inserted in said block turbo-code at locations where said predetermined information elements have been removed.

* * * * *